June 6, 1967 J. E. HARRISON 3,324,409

SPECTRUM GENERATOR WITH VERNIER FREQUENCY ADJUSTMENT CAPABILITY

Filed Aug. 26, 1964 2 Sheets-Sheet 1

INVENTOR.
JOHN E. HARRISON

BY [signature]
ATTORNEY

INVENTOR.
JOHN E. HARRISON
BY Martin Kaeh[illegible]
ATTORNEY

United States Patent Office 3,324,409
Patented June 6, 1967

3,324,409
SPECTRUM GENERATOR WITH VERNIER FREQUENCY ADJUSTMENT CAPABILITY
John E. Harrison, Rochester, N.Y., assignor to General Dynamics Corporation, a corporation of Delaware
Filed Aug. 26, 1964, Ser. No. 392,241
4 Claims. (Cl. 331—49)

The present invention relates to electronic signal generators, and particularly to a signal generator for providing a signal having frequency components spaced over a frequency spectrum.

The invention is especially suitable for use in providing signals for frequency translation purposes as in radio communications apparatus and in electronic test equipment.

The frequency components of the signal produced by a generator embodying the invention may be separated by equal frequency increments extending over the frequency spectrum. Thus, a generator embodying the invention may be termed "a spectrum generator."

Changing the frequency of the spectrum components of the signal produced by a spectrum generator has presented several difficulties. When a spectrum generator is controlled by a reference frequency signal, the spectrum components tend to lock to frequencies which are integral multiples of the reference frequency. Thus, attempts to vary the frequencies of the spectrum components from the frequencies at which they tend to lock are generally unsuccessful, especially when small or vernier changes in spectrum component frequency are desired. Spurious frequencies components, for example, components at other than the desired frequency spacing, may be generated when spectrum component frequencies are altered. The amplitude of the spectrum components also tend to change when their frequency is altered. Such amplitude changes may be disadvantageous.

It is an object of the present invention to provide an improved electronic signal generator for producing a signal including a spectrum of frequency components.

It is another object of the invention to provide an improved electronic signal generator for producing a spectrum of frequency components, the frequencies of which may be varied.

It is still another object of the present invention to provide an improved electronic signal generator for producing a spectrum of frequency components which is adapted for use in radio communications apparatus, such as receivers and transmitters, wherein the frequencies of the components may be varied to facilitate tuning of the apparatus.

It is a further object of the present invention to provide an improved spectrum generator for producing a spectrum of frequency components which may be varied in frequency and in which the above mentioned difficulties and disadvantages are effectively eliminated.

Briefly described, a spectrum generator embodying the invention includes a circuit which is conditionable into amplifier or oscillator modes of operation and which, when keyed, produces a signal having a spectrum of frequency components. A variable frequency oscillator is adapted to be connected to the amplifier/oscillator circuit, and when so connected conditions the circuit into its amplifier mode of operation. The frequencies of the spectrum components produced by the amplifier/oscillator circuit, when it is keyed, may be varied by varying the frequency of the variable frequency oscillator.

The invention itself, both as to its organization and method of operation, as well as additional objects and advantages thereof will become more readily apparent from a reading of the following description in connection with the accompanying drawings in which.

Figure 1:
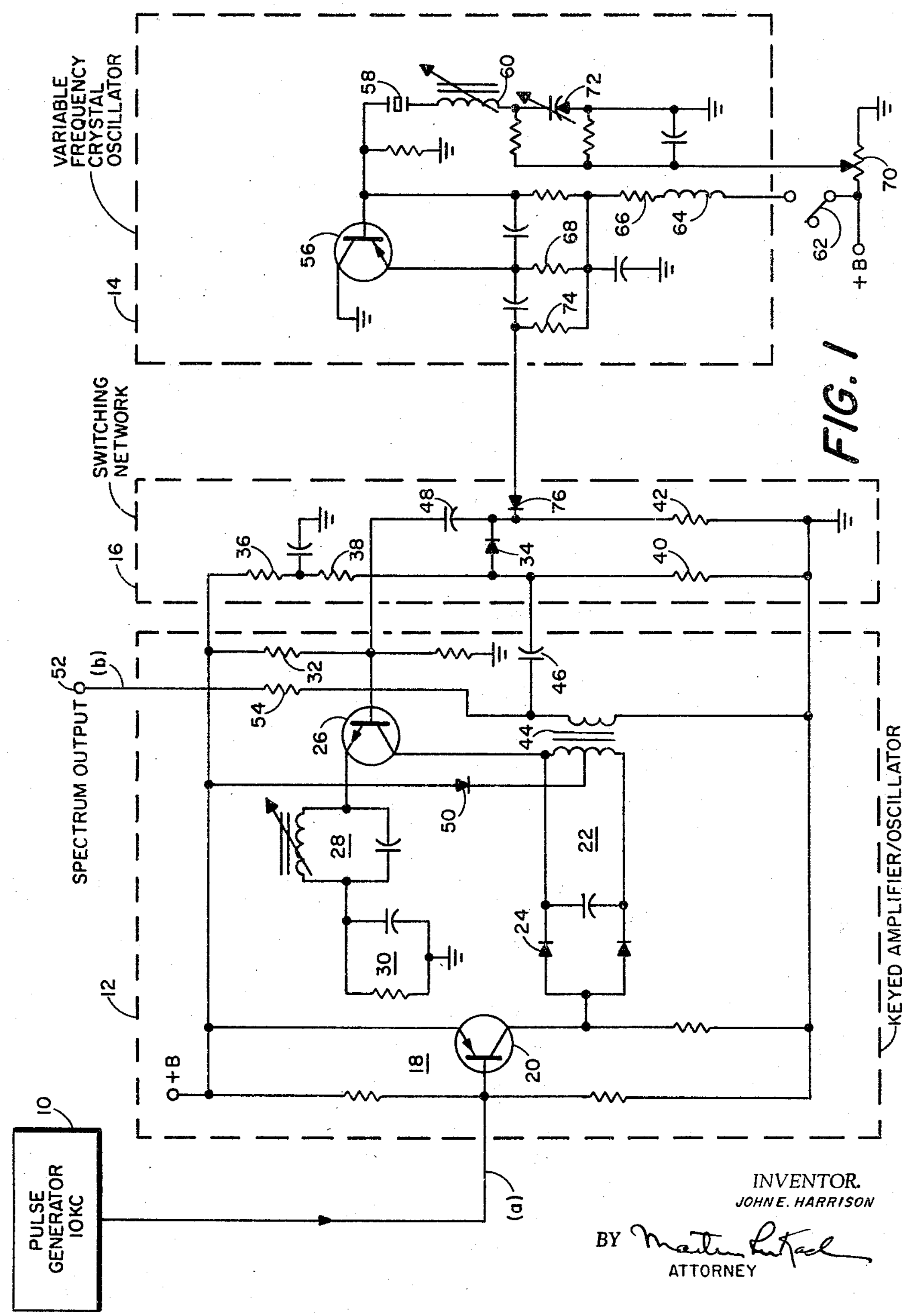
FIG. 1 is a circuit and block diagram showing a signal generator embodying the invention.

Referring more particularly to FIG. 1, there is shown a pulse generator 10 which supplies keying pulses to a keyed amplifier/oscillator circuit 12. A variable frequency oscillator 14 is connected through a switching network 16 to the amplifier/oscillator 12. The pulse generator is indicated as providing a train of pulses which are repetitive at a frequency of ten kc. This generator may include a frequency divider chain which serves to divide the output signals from a source of reference frequency signals such as a stable crystal oscillator of high frequency accuracy.

The output pulses are applied to the base of a keying stage 18, which forms part of the keyed amplifier/oscillator 12. The keying stage includes a transistor 20, normally biased on a conductive state, which is switched "off" or into a non-conductive state upon application thereto of a keying pulse from the pulse generator 10.

The collector of the transistor 20 is connected to the tank circuit 22 of the amplifier/oscillator 12 through a pair of diodes 24. The diodes 24 provide for balancing of direct currents which flow through the tank circuit 22 and reduce switching transients which might otherwise generate spurious frequency signals. The tank circuit 22 is connected to the collector of a transistor 26. The emitter of this transistor 26 is connected to ground or other suitable point of reference potential by way of trap circuits 28 and 30.

By virtue of a biasing circuit 32, which is connected to the base of the transistor 26 and the voltage aplied to the collector of the transistor 26 via a diode 50 and from the collector circuit of the keying stage transistor 20, the transistor 26 is normally conductive.

The switching network 16 provides a regenerative feedback path between the tank circuit 22 and the base input circuit of the transistor 26. This regenerative circuit includes a diode 34 which is normally biased in the forward direction by voltages applied thereto through biasing resistors 36, 38, 40 and 42 in the switching network 16. The inductive element of the tank circuit is a transformer 44. A winding of this transformer is connected through capacitors 46 and 48 to complete the regenerative feedback circuit. This feed-back circuit is operative so long as the crystal oscillator 14 is inoperative, as will be explained more fully hereinafter. Accordingly the amplifier/oscillator 12 is normally conditioned for operation in its oscillator mode.

Figure 2:
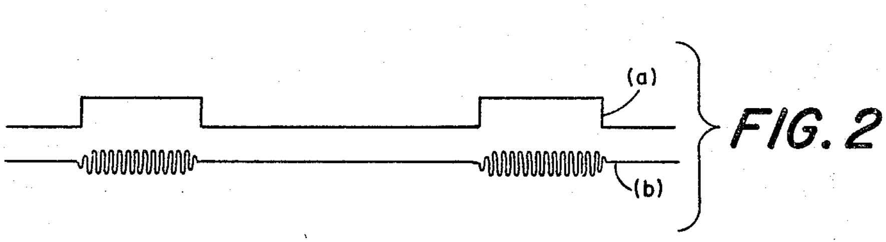
FIG. 2 are wave-forms of the keying pulses and output signal of the generator illustrated in FIG. 1.

When keying pulses are applied to the amplifier/oscillator 12 from the pulse generator, such pulses being illustrated for example in wave-form (*a*) of FIG. 2, the transistor 20 switches "off." Ground is then effectively connected to the ends of the transformer 44 primary; thus removing an effective short circuit across the primary which theretofore existed by reasons of B+ being connected to the opposite ends of the primary via the emitter-collector path of the keying transistor 20 and the diodes 24.

Figure 3:
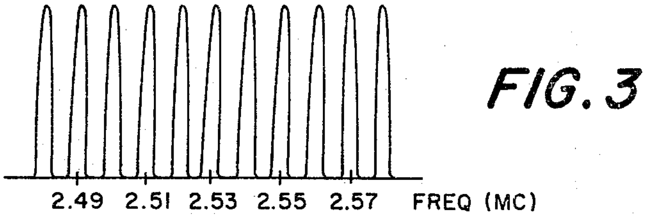
FIG. 3 is a more detailed wave form showing a portion of the spectrum of the output signal generated by the generator illustrated in FIG. 1.

A burst of oscillations is then produced by the oscillator as indicated in wave-form (*b*) of FIG. 2. This burst of oscillations is derived as an output signal at a terminal 52 which is connected to a winding of the transformer 44 through a resistor 54. This output signal contains a spectrum of frequency components, spaced from each other by equal frequency increments depending upon the frequency of the keying pulses from the pulse generator 10. By way of example, the amplifier/oscillator may have a frequency of oscillation of 2.53 mc., the latter being the frequency of resonance of tank circuit 22. Accordingly, the output signal includes spectrum components spaced from each other by 10 kc. about the oscillation frequency of 2.53 mc. Such spectrum components are illustrated in FIG. 3.

Trap circuits 28 and 30 are tuned to frequencies between the spectrum frequencies. The oscillator will not support oscillation at these spurious frequencies by virtue of the inclusion of the trap circuits 28 and 30.

The variable frequency crystal oscillator 14 includes a transistor 56 which is connected in a Colpitts type oscillator circuit, which circuit is also known as a Clapp oscillator. The frequency of this oscillator is determined by a crystal 58 and a variable inductor 60 which is connected in series to the base of the transistor 56. Operating voltage for the oscillator is applied from the source at +B through a switch 62. The switch is connected to the emitter of the transistor by way of a choke coil 64 and resistors 66 and 68. A potentiometer 70 is connected between ground and the source at +B. This potentiometer applies voltages across a voltage variable capacitor 72 which is connected in series with the inductor 60 and crystal 58 of the oscillator 14. The oscillator has a nominal frequency of oscillation equal to the crystal resonant frequency. Preferably, this frequency of oscillation is the same as the frequency of oscillation of the keyed amplifier/oscillator 12; namely 2.53 mc. In a typical case the frequency of oscillation of the variable frequency oscillator 14 may be + or − five-hundred (500) cycles on opposite sides thereof the nominal oscillation frequency of 2.53 mc.

The variable frequency oscillator 14 is inoperative until the switch 62 is closed, since otherwise an operating voltage is not applied thereto. Operating voltage is also applied through the switch 62, the choke 64, the resistor 66 and another resistor 74 to a diode 76 in the switching network 16. Current flows through the last named circuit elements and the resistor 42 in the switching network 16 to ground. The voltage drop across the resistor 42 biases the diode 34, which is also contained in the regenerative feed-back circuit of the oscillator 12, in the reverse direction. Accordingly, the regenerative feed-back circuit is opened and the oscillator functions as an amplifier. Input signals to the amplifier are applied from the variable frequency oscillator 14 through the diode 76 and the capacitor 48 in the switching network 16.

The transistor 26 in the amplifier is inoperative to amplifier signals in the frequency range of interest until a keying pulse is applied to the base of the keying stage transistor 20. Then, the transformer 44 primarily short is removed and the amplifier 26 is rendered operative in the frequency range of interest. The result of such amplifier operation during the keying pulse is an output signal which is available at the output terminal 52. The spectrum components of this output signal are also separated from each other by the frequency of the keying pulses, namely 10 kc. However, the center frequency of the spectrum components is equal to the frequency of the variable crystal oscillator, rather than the frequency of the tuned circuits in the amplifier 12. Thus, by varying the frequency of the variable frequency crystal oscillator using the potentiometer 70, as a frequency control, the frequencies of the spectrum components may be varied, while their frequency separation remains the same.

Figure 4:
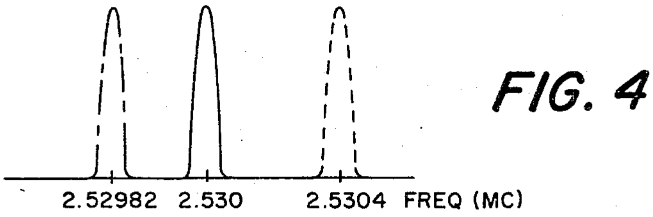
FIG. 4 is a wave-form diagram showing one of the spectrum components which is generated by the generator, which component may have any one of three different frequencies.

FIG. 4 illustrates the center frequency spectrum component. The frequency of this component is 2.530 mc. when the frequency of the variable frequency crystal oscillator 14 is the same as the frequency of the tuned circuits in the amplifier 12; namely, 2.530 mc. This frequency component is shown by the solid line curve in FIG. 4. As shown by the dashed curve in FIG. 4, this frequency component is adjusted or varied to 2.5304 mc., when the frequency of the crystal oscillator 14 is pulled to 2.5304 mc. The curve, made up of long and short dashes shows the frequency of this component as being 2.52982 mc., when the frequency of the crystal oscillator 14 is reduced to 2.52982 mc. The amplitudes of these frequency components also are unaltered in spite of their adjustment in variation or frequency. Spurious components are not generated in the keyed amplifier oscillator 12 because the tuning of the tuned circuit 22 and the trap circuits 28 and 30 is not varied when the frequency of the spectrum components is varied. Accordingly, vernier adjustment of the frequency of the spectrum components is readily obtainable without adverse effects such as amplitude variations and the generation of spurious components.

From the foregoing description, it will be apparent that there has been provided an improved signal generator which is operative as a spectrum generator and which has a vernier mode of operation. Although only a single embodiment of the invention has been described, it will be appreciated that variations and modifications of circuit elements, components and frequencies will become apparent to those skilled in the art. Accordingly, the foregoing description should be taken merely as illustrative and not in any limiting sense.

What is claimed is:

1. A signal generator comprising (a) an amplifier circuit having an input and an output, a regenerative feedback network connected between said input and said output and a tuned circuit resonant at a certain frequency, (b) mean including switching means for selectively conditioning said amplifier circuit into oscillator and amplifier modes of operation, (c) a variable frequency oscillator coupled to said amplifier circuit through said switching means when said amplifier circuit is conditioned for its amplifier mode of operation operative for applying its output signal to said amplifier circuit, and (d) means coupled to said tuned circuit for keying said amplifier circuit to provide an output signal including a spectrum of frequency components.

2. A signal generator comprising (a) an amplifier circuit having an input and an output, a regenerative feedback network connected between said input and said output and a tuned circuit resonant at a certain frequency, (b) a diode switching network for connecting said regenerative feedback circuit into said amplifier and converting said amplifier into an oscillator, (c) a variable frequency oscillator connected to said amplifier circuit, (d) means for applying operating voltage to said oscillator and to said switching network for disconnecting said regenerative circuit from said amplifier and simultaneously rendering said variable frequency oscillator operative, and (e) means coupled to said tuned circuit for keying said amplifier circuit for producing an output signal including a spectrum of frequency components.

3. A spectrum generator comprising an amplifier circuit having an output and an output, a feedback network connected between said input and output, and including a switching element, a variable frequency oscillator, another switching element connecting said variable frequency oscillator to said input means for alternately rendering different ones of said switching elements operative, said amplifier also including a tuned circuit resonant at a frequency in the range of frequencies produced by said oscillator and keying means connected to said tuned circuit for operating said amplifier to produce a spectrum of frequency components.

4. The invention as set forth in claim 3, wherein said variable frequency oscillator includes a crystal having a frequency equal to the resonant frequency of said tuned circuit.

References Cited

UNITED STATES PATENTS

| | | | |
|---|---|---|---|
| 2,114,332 | 4/1938 | Bruckner et al. | 331—173 X |
| 2,764,689 | 9/1956 | Struven | 331—172 X |
| 2,905,907 | 9/1959 | Sanders | 331—173 |
| 2,958,049 | 10/1960 | Fraser et al. | 331—55 |
| 2,985,845 | 5/1961 | Anderson et al. | 331—172 X |
| 3,215,947 | 11/1965 | Loughlin et al. | 331—51 |

ROY LAKE, *Primary Examiner.*

J. B. MULLINS, *Assistant Examiner.*